United States Patent
Lin et al.

(10) Patent No.: US 8,884,267 B2
(45) Date of Patent: Nov. 11, 2014

(54) LIGHT-EMITTING ELEMENT WITH MULTIPLE LIGHT-EMITTING STACKED LAYERS

(75) Inventors: Yi-Chieh Lin, Tainan (TW); Rong-Ren Lee, Tainan (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/546,636

(22) Filed: Jul. 11, 2012

(65) Prior Publication Data

US 2013/0015425 A1   Jan. 17, 2013

(30) Foreign Application Priority Data

Jul. 12, 2011  (TW) .............................. 100124718 A

(51) Int. Cl.
| | |
|---|---|
| H01L 29/06 | (2006.01) |
| H01L 27/15 | (2006.01) |
| H01L 29/66 | (2006.01) |
| H01L 33/06 | (2010.01) |
| H01L 33/00 | (2010.01) |
| H01L 33/08 | (2010.01) |
| H01L 33/32 | (2010.01) |

(52) U.S. Cl.
CPC .............. *H01L 33/06* (2013.01); *H01L 27/153* (2013.01); *H01L 33/0079* (2013.01); *H01L 33/08* (2013.01); *H01L 33/32* (2013.01)
USPC ................... 257/13; 257/79; 257/99

(58) Field of Classification Search
CPC ..... H01L 33/0079; H01L 33/06; H01L 33/08; H01L 33/32; H01L 27/153
USPC ...................... 257/13, 103, 79, 99
See application file for complete search history.

(56) References Cited

U.S. PATENT DOCUMENTS

| | | | |
|---|---|---|---|
| 5,212,706 A | 5/1993 | Jain | |
| 6,163,038 A * | 12/2000 | Chen et al. | 257/103 |
| 7,095,052 B2 | 8/2006 | Lester | |
| 2001/0043629 A1* | 11/2001 | Sun et al. | 372/43 |
| 2003/0197169 A1* | 10/2003 | Lee et al. | 257/14 |
| 2003/0234404 A1* | 12/2003 | Matsuoka et al. | 257/103 |
| 2006/0162768 A1* | 7/2006 | Wanlass et al. | 136/262 |
| 2007/0158659 A1* | 7/2007 | Bensce | 257/79 |
| 2008/0035910 A1* | 2/2008 | Kyono et al. | 257/14 |
| 2009/0309120 A1* | 12/2009 | Heidborn et al. | 257/99 |

FOREIGN PATENT DOCUMENTS

| | | |
|---|---|---|
| JP | 2004-327719 A | 11/2004 |
| TW | 200410425 | 6/2004 |
| TW | I291247 | 12/2007 |

* cited by examiner

*Primary Examiner* — Long K Tran
*Assistant Examiner* — Dzung Tran
(74) *Attorney, Agent, or Firm* — Muncy, Geissler, Olds & Lowe, P.C.

(57) ABSTRACT

A light-emitting element, comprises: a first active layer, generating a first light comprising a first dominant wavelength, wherein the first active layer comprises a first quantum well comprising a first quantum-well band gap and a second quantum well comprising a second quantum-well band gap, and the first quantum well and the second quantum well are alternately stacked to form the first active layer, wherein a difference between the first quantum-well band gap and the second quantum-well band gap is between 0.06eV and 0.1eV, and each of the first quantum-well and the second quantum-well is devoid of a barrier; and a second active layer on the first active layer, generating a second light comprising a second dominant wavelength; wherein a difference between the first dominant wavelength and the second dominant wavelength is 150nm to 220nm.

18 Claims, 1 Drawing Sheet

LIGHT-EMITTING ELEMENT WITH MULTIPLE LIGHT-EMITTING STACKED LAYERS

RELATED APPLICATION

This application claims the benefit of TW application Ser. No. 100124718, filed Jul. 12, 2011, entitled "A LIGHT-EMITTING ELEMENT WITH MULTIPLE LIGHT-EMITTING STACKED LAYERS", the contents of which are incorporated herein by reference in their entirety.

BACKGROUND

1. Technical Field

The present disclosure relates to a light-emitting element, and more particularly, to a light-emitting element having multiple light-emitting stacked layers.

2. Description of the Related Art

Light-emitting Diode (LED) is a solid state semiconductor element comprising a p-n junction formed between a p-type semiconductor layer and an n-type semiconductor layer. When imposing a certain level of forward voltage to the p-n junction, holes from the p-type semiconductor layer and electrons from the n-type semiconductor layer are combined to release light. The region for light releasing is generally called light-emitting region.

The primary features of an LED include its small size, excellent CRI, high reliability, high efficiency, long life, and short initial illumination time. The LED has been applied widely to optical display devices, traffic signals, data storing devices, communication devices, illumination devices, and medical apparatuses. Along with the launch of the full-color LED, LED has gradually replaced traditional lighting apparatus such as fluorescent lights and incandescent lamps.

The price of the substrate occupies large proportion to the cost of manufacturing LED. Therefore, how to reduce the amount of utilizing substrate raises concern.

SUMMARY OF THE DISCLOSURE

A light-emitting element, comprises: a first active layer, generating a first light comprising a first dominant wavelength, wherein the first active layer comprises a first quantum well comprising a first quantum-well band gap and a second quantum well comprising a second quantum-well band gap, and the first quantum well and the second quantum well are alternately stacked to form the first active layer, wherein a difference between the first quantum-well band gap and the second quantum-well band gap is between 0.06eV and 0.1eV, and each of the first quantum-well and the second quantum-well is devoid of a barrier; and a second active layer on the first active layer, generating a second light comprising a second dominant wavelength; wherein a difference between the first dominant wavelength and the second dominant wavelength is 1.50nm to 220mn.

A light-emitting element, comprises: a first active layer, comprising a first band gap, wherein the first active layer comprises a first quantum well comprising a first quantum-well band gap and a second quantum well comprising a second quantum-well band gap, and the first quantum well and the second quantum well are alternately stacked to form the first active layer, wherein a difference between the first quantum-well band gap and the second quantum-well band gap is between 0.06eV and 0.1eV; and a second active layer on the first active layer, comprising a second band gap; wherein a difference between the first band gap and the second band gap is between 0.3eV and 0.5eV.

A light-emitting element, comprises: a first active layer, generating an invisible light, wherein the first active layer comprises a first quantum well comprising a first quantum-well band gap and a second quantum well comprising a second quantum-well band gap, and the first quantum well and the second quantum well are alternately stacked to form the first active layer, wherein a difference between the first quantum-well band gap and the second quantum-well band gap is between 0.06eV and 0.1eV, and each of the first quantum-well and the second quantum-well is devoid of a barrier; and a second active layer on the first active layer, generating a visible light.

BRIEF DESCRIPTION OF THE DRAWINGS

The accompanying drawings are included to provide easy understanding of the application, and are incorporated herein and constitute a part of this specification. The drawings illustrate embodiments of the application and, together with the description, serve to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of the embodiments of the present disclosure in accordance with the drawings.

Figure 1:
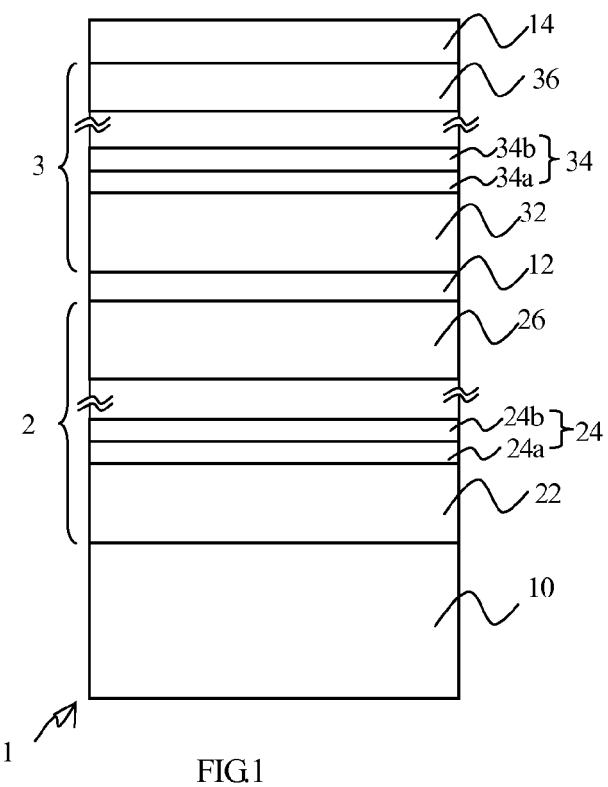
FIG. 1 illustrates a cross-sectional view of a light-emitting element in accordance with an embodiment of the present application.

FIG. 1 discloses a light-emitting element 1 including a substrate 10; a first light-emitting stacked layer 2 formed on the substrate 10; a tunneling layer 12 formed on the first light-emitting stacked layer 2; a second light-emitting stacked layer 3 formed on the tunneling layer 12; and a contact layer 14 formed on the second light-emitting stacked layer 3. The first light-emitting stacked layer 2 includes a first semiconductor layer 22, a first active layer 24, and a second semiconductor layer 26 sequentially formed between the substrate 10 and the tunneling layer 12. The second light-emitting stacked layer 3 includes a third semiconductor layer 32, a second active layer 34, and a forth semiconductor layer 36 sequentially formed between the contact layer 14 and the tunneling layer 12. There is a light-emitting stacked layer formed on a substrate in a conventional light-emitting element. The light-emitting element 1 includes two light-emitting stacked layers on the substrate 10 in this embodiment. One of the advantages is that the light-emitting efficiency of the light-emitting element 1 is about the same as the sum of the light-emitting efficiency of two conventional light-emitting elements. Moreover, it can reduce the cost of manufacturing by reducing the amount of the substrate because the light-emitting element 1 only uses one substrate, comparing to the two conventional light-emitting element using two substrates.

The substrate 10 can be for growing and/or supporting the light-emitting stacked layers thereon. The material of the substrate 10 includes insulating material such as sapphire, diamond, glass, quartz, acryl, or AlN, or conductive material such as Cu, Al, diamond like carbon (DLC), SiC, metal matrix composite (MMC), ceramic matrix composite (CMC), Si, IP, GaAs, Ge, GaP, GaAsP, ZnSe, ZnO, InP, LiGaO$_2$, or LiAlO$_2$. The material of the substrate 10 for growing the light-emitting stacked layers, for example, can be sapphire, GaAs, or SiC.

The first light-emitting stacked layer 2 and/or the second light-emitting stacked layer 3 can be directly grown on the substrate 10, or fixed on the substrate 10 by a bonding layer (not shown). The material of the first light-emitting stacked layer 2 and the second light-emitting stacked layer 3 includes a semiconductor material containing more than one element selected from a group consisting of Ga, Al, In, As, P, N, Zn, Cd, and Se. The polarities of the first semiconductor layer 22 and the second semiconductor layer 26 are different. The polarities of the third semiconductor layer 32 and the forth semiconductor layer 36 are different. The first active layer 24 and the second active layer 34 can emit light, wherein the first active layer 24 includes a first band gap and the second active layer 34 includes a second band gap. The first band gap and the second band gap are different in this embodiment. The difference between the first band gap and the second band gap is between 0.3 eV and 0.5 eV. The first band gap can be smaller or larger than the second band gap. The first band gap is 1.45 eV and the second band gap is 1.9 eV, for instance. In another embodiment, the light generated from the first active layer 24 is invisible to the eyes of humans. The wavelength of the invisible light is about smaller than 400 nm or larger than 780 nm. It can be better between 780 nm and 2500 nm or between 300 nm and 400 nm, preferably between 780 nm and 900 nm, in this embodiment. The light generated from the second active layer 34 is visible to the eyes of humans. The wavelength of the visible light is about between 400 nm and 780 nm, preferably between 560 nm and 750 nm, in this embodiment. In another embodiment, the light generated from the first active layer 24 includes a first dominant wavelength and the light generated from the second active layer 34 includes a second dominant wavelength, wherein the difference between the first dominant wavelength and the second dominant wavelength is about 150 nm to 220 nm, and the first dominant wavelength can be larger or smaller than the second dominant wavelength. This embodiment can be applied to medical treatment. One of the advantages is that a single light-emitting element can include different functions, for example, the first dominant wavelength of 815 nm can promote healing the wound, and the second dominant wavelength of 633 nm can eliminate wrinkles.

In another embodiment, a first quantum well 24a and a second quantum well 24b are stacked alternately to form the first active layer 24. The first quantum well 24a incudes a first quantum-well band gap and the second quantum well 24b incudes a second quantum-well band gap, wherein the first quantum-well band gap is different from the second quantum-well band gap. The difference between the first quantum-well band gap and the second quantum-well band gap is about 0.06 eV to 0.1 eV, and the first quantum-well band gap can be smaller or larger than the second quantum-well band gap. A third quantum well 34a and a forth quantum well 34b are stacked alternately to form the second active layer 34. The third quantum well 34a includes a third quantum-well band gap and the forth quantum well 34b incudes a forth quantum-well band gap, wherein the third quantum-well band gap is different from the forth quantum-well band gap. The difference between the third quantum-well band gap and the forth quantum-well band gap is about 0.06 eV to 0.1 eV, and the third quantum-well band gap can be smaller or larger than the forth quantum-well band gap.

The tunneling layer 12 is grown on the first light-emitting stacked layer 2. The doping concentration of the tunneling layer 12 is larger than $8 \times 10^{18}/cm^3$ so the electrons can pass it because of the tunneling effect. The material of the tunneling layer 12 includes semiconductor material containing more than one element selected from a group consisting of Ga, Al, In, As, P, N, Zn, Cd, and Se. In another embodiment, the tunneling layer 12 can be replaced by a first bonding layer to bond the first light-emitting stacked layer 2 to the second light-emitting stacked layer 3. The material of the first bonding layer includes transparent conductive material such as ITO, InO, SnO, CTO, ATO, ZnO, MgO, AlGaAs, GaN, GaP, AZO, ZTO, GZO, IZO, or Ta$_2$O$_5$, or insulating material such as Su8, benzocyclobutene (BCB), perfluorocyclobutane (PFCB), epoxy, acrylic resin, cyclic olefin copolymers (COC), polymethyl methacrylate (PMMA), polyethylene terephthalate (PET), polyimide (PI), polycarbonate (PC), polyetherimide, fluorocarbon polymer, glass, Al$_2$O$_3$, SiO$_2$, TiO$_2$, SiN$_x$, spin-on-glass (SOG), or tetraethoxysilane (TEOS). The contact layer 14 is for conducting current. The material of the contact layer 14 includes GaP, Al$_x$Ga$_{1-x}$As ($0 \leq x \leq 1$), or Al$_a$Ga$_b$In$_{1-a-b}$P ($0 \leq a \leq 1$, $0 \leq b \leq 1$, $0 \leq a+b \leq 1$).

Figure 2:
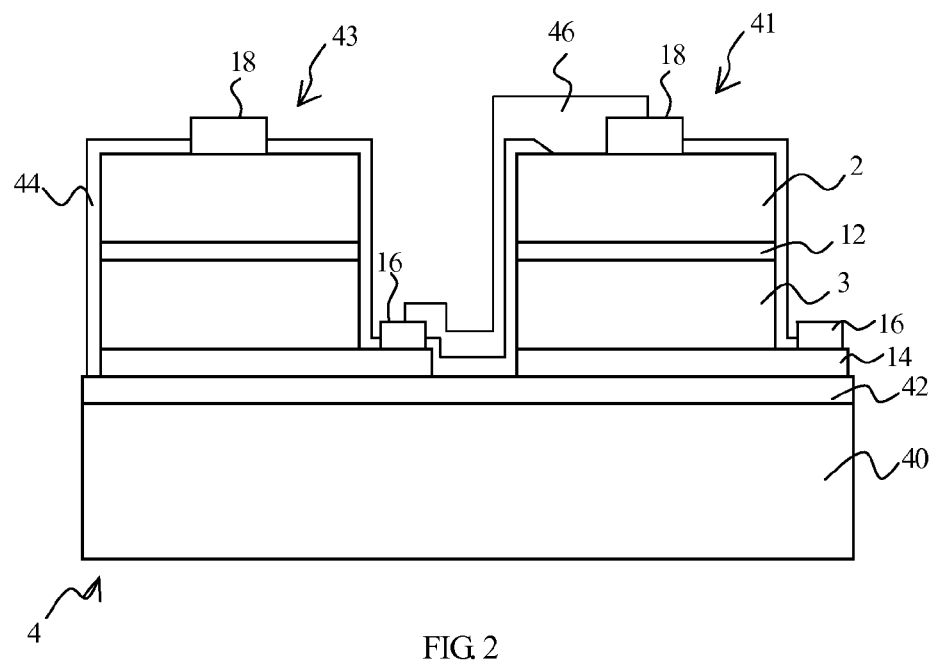
FIG. 2 illustrates a cross-sectional view of a light-emitting element in accordance with another embodiment of the present application.

Referring to FIG. 2, a light-emitting device 4 includes a carrier 40; a second bonding layer 42 on the carrier 40; a first light-emitting structure 41 and a second light-emitting structure 43 on the second bonding layer 42; an insulating layer 44 on the second bonding layer 42, the light-emitting structure 41 and the second light-emitting structure 43, and an electrical-connecting structure 46 on the insulating layer 44 to electrically connect the light-emitting structure 41 and the second light-emitting structure 43. The light-emitting structure 41 and the second light-emitting structure 43 are similar to the aforementioned light-emitting element 1, and include the first light-emitting stacked layer 2; the tunneling layer 12; the second light-emitting stacked layer 3, and the contact layer 14 on the second bonding layer 42. The light-emitting structure 41 and the second light-emitting structure 43 respectively further include a first electrode 16 on the contact layer 14 and a second electrode 18 on the first light-emitting stacked layer 2. The electrical-connecting structure 46 can electrically connect the second electrode 18 of the first light-emitting structure 41 with the first electrode 16 of the second light-emitting structure 43.

The carrier 40 can be for growing and/or supporting the light-emitting structures thereon. The material of the carrier 40 includes insulating material such as sapphire, diamond, glass, quartz, acryl, ZnO, or AlN, or conductive material such as Cu, Al, diamond like carbon (DLC), SiC, metal matrix composite (MMC), ceramic matrix composite (CMC), Si, IP, ZnSe, GaAs, Ge, GaP, GaAsP, InP, LiGaO$_2$, or LiAlO$_2$. The material of the carrier 40 for growing light-emitting structures, for example, can be sapphire, GaAs, or SiC.

The second bonding layer 42 is for bonding the light-emitting structures and the carrier 40. The material of the second bonding layer 42 can be transparent bonding material such as such as Sub, benzocyclobutene (BCB), perfluorocyclobutane (PFCB), epoxy, acrylic resin, cyclic olefin copolymers (COC), polyimide (PI), polymethyl methacrylate (PMMA), polyethylene terephthalate (PET), polycarbonate (PC), polyetherimide, fluorocarbon polymer, glass, Al$_2$O$_3$, SiO$_2$, TiO$_2$, SiN$_x$, spin-on-glass (SOG), or tetraethoxysilane (TEOS). The second bonding layer 42 can be insulating material to electrically insulate the first light-emitting structure 41 from the second light-emitting structure 43. The second bonding layer 42 can be replaced by a buffer layer for growing the light-emitting structures in another embodiment. The material of the buffer layer includes $Al_xGa_{1-x}As$ ($0 \le x \le 1$), $Al_aGa_bIn_{1-a-b}P$ ($0 \le a \le 1$, $0 \le b \le 1$, $0 \le a+b \le 1$), or $Al_aGa_bIn_{1-a-b}N$ ($0 \le a \le 1$, $0 \le b \le 1$, $0 \le a+b \le 1$).

The insulating layer 44 is for protecting and insulating the first light-emitting structure 41 from the second light-emitting structure 43. The material of the insulating layer 44 can be insulating material such as such as Su8, benzocyclobutene (BCB), perfluorocyclobutane (PFCB), epoxy, acrylic resin, cyclic olefin copolymers (COC), polymethyl methacrylate (PMMA), polyethylene terephthalate (PET), polyimide (PI), polycarbonate (PC), polyetherimide, fluorocarbon polymer, glass, $Al_2O_3$, $SiO_2$, $TiO_2$, $SiN_x$, spin-on-glass (SOG), or tetraethoxysilane (TEOS). The electrical-connecting structure 46 is for electrically connecting the first light-emitting structure 41 and the second light-emitting structure 43. The material of the electrical-connecting structure 46 can be transparent conductive material such as ITO, InO, SnO, CTO, ATO, ZnO, MgO, AlGaAs, GaN, GaP, AZO, ZTO, GZO, IZO, or $Ta_2O_5$, or metal material such as Ge, Cu, Al, Mo, Cu—Sn, Cu—Zn, Cu—Cd, Ni—Sn, Ni—Co, or Au alloy.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting element, comprising:
   a first active layer, generating a first light comprising a first dominant wavelength, wherein the first active layer comprises a first quantum well comprising a first quantum-well band gap and a second quantum well comprising a second quantum-well band gap, and the first quantum well and the second quantum well are alternately stacked to form the first active layer, wherein a difference between the first quantum-well band gap and the second quantum-well band gap is between 0.06 eV and 0.1 eV, and each of the first quantum-well and the second quantum-well is devoid of a barrier; and
   a second active layer on the first active layer, generating a second light comprising a second dominant wavelength;
   wherein a difference between the first dominant wavelength and the second dominant wavelength is 150 nm to 220 nm.

2. The light-emitting element of claim 1, further comprising a substrate under the first active layer,
   wherein the first dominant wavelength is larger than the second dominant wavelength.

3. The light-emitting element of claim 1, wherein a wavelength of the first dominant wavelength is between 780 nm and 900 nm.

4. The light-emitting element of claim 1, wherein a wavelength of the second dominant wavelength is between 560 nm and 750 nm.

5. A light-emitting element, comprising:
   a first active layer, comprising a first band gap, wherein the first active layer comprises a first quantum well comprising a first quantum-well band gap and a second quantum well comprising a second quantum-well band gap, and the first quantum well and the second quantum well are alternately stacked to form the first active layer, wherein a difference between the first quantum-well band gap and the second quantum-well band gap is between 0.06 eV and 0.1 eV; and
   a second active layer on the first active layer, comprising a second band gap;
   wherein a difference between the first band gap and the second band gap is between 0.3 eV and 0.5 eV.

6. The light-emitting element of claim 5, further comprising a substrate under the first active layer,
   wherein the first band gap is larger than the second band gap.

7. The light-emitting element of claim 5, wherein the second active layer comprises a third quantum well and a forth quantum well alternately stacked to form the second active layer, and each of the third quantum-well and the fourth'd of a barrier.

8. The light-emitting element of claim 7, wherein the third quantum well comprises a third quantum-well band gap, a forth quantum well comprises a forth quantum-well band gap, and a difference between the third quantum-well band gap and the forth quantum-well band gap is between 0.06 eV and 0.1 eV.

9. The light-emitting element of claim 5, further comprising:
   a substrate under the first active layer;
   a first semiconductor layer between the first active layer and the substrate;
   a second semiconductor layer between the first active layer and the second active layer;
   a third semiconductor layer between the second semiconductor layer and the second active layer; and
   a forth semiconductor layer on the second active layer.

10. The light-emitting element of claim 9, wherein a material of the substrate is selected from a group consisting of GaAs, SiC, and sapphire.

11. The light-emitting element of claim 9, wherein materials of the first semiconductor layer, the second semiconductor layer, the third semiconductor layer, and/or the forth semiconductor layer comprise more than one element selected from a group consisting of Ga, Al, In, As, P, N, Zn, Cd, and Se.

12. The light-emitting element of claim 9, further comprising a tunneling layer or a bonding layer between the second semiconductor layer and the third semiconductor layer.

13. The light-emitting element of claim 12, wherein a material of the tunneling layer comprises more than one element selected from a group consisting of Ga, Al, In, As, P, N, Zn, Cd, and Se.

14. The light-emitting element of claim 12, wherein a material of the bonding layer is selected from a group consisting of ITO, InO, SnO, CTO, ATO, ZnO, MgO, AlGaAs, GaN, GaP, AZO, ZTO, GZO, IZO, and Ta2O5.

15. The light-emitting element of claim 5, wherein a material of the first active layer and/or the second active layer comprise more than one element selected from a group consisting of Ga, Al, In, As, P, N, Zn, Cd, and Se.

16. A light-emitting element, comprising:
    a first active layer, generating an invisible light, wherein the first active layer comprises a first quantum well comprising a first quantum-well band gap and a second quantum well comprising a second quantum-well band gap, and the first quantum well and the second quantum well are alternately stacked to form the first active layer, wherein a difference between the first quantum-well band gap and the second quantum-well band gap is between 0.06 eV and 0.1 eV, and each of the first quantum-well and the second quantum-well is devoid of a barrier; and a second active layer on the first active layer, generating a visible light.

17. The light-emitting element of claim 16, further comprising a substrate under the first active layer,
wherein the first active layer comprises a first band gap, the second active layer comprises a second band gap, and the first band gap is larger than the second band gap.

18. The light-emitting element of claim 16, wherein a difference between the wavelength of the visible light and the invisible light is between 150 nm and 220 nm.

* * * * *